(12) United States Patent
Harada (10) Patent No.: US 9,786,490 B2
(45) Date of Patent: Oct. 10, 2017

(54) WAFER PROCESSING METHOD AND ELECTRONIC DEVICE

(71) Applicant: DISCO CORPORATION, Tokyo (JP)

(72) Inventor: Seiji Harada, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/225,360

(22) Filed: Aug. 1, 2016

(65) Prior Publication Data

US 2017/0047221 A1    Feb. 16, 2017

(30) Foreign Application Priority Data

Aug. 14, 2015   (JP) .................... 2015-160091

(51) Int. Cl.
| | |
|---|---|
| *H01L 21/02* | (2006.01) |
| *H01L 21/683* | (2006.01) |
| *H01L 21/78* | (2006.01) |
| *H01L 21/304* | (2006.01) |
| *H01L 21/67* | (2006.01) |

(52) U.S. Cl.
CPC .. *H01L 21/02115* (2013.01); *H01L 21/02274* (2013.01); *H01L 21/304* (2013.01); *H01L 21/67092* (2013.01); *H01L 21/67132* (2013.01); *H01L 21/6836* (2013.01); *H01L 21/78* (2013.01); *H01L 2221/6834* (2013.01); *H01L 2221/68327* (2013.01); *H01L 2221/68336* (2013.01)

(58) Field of Classification Search
CPC . H01L 21/304; H01L 21/78; H01L 21/30625; H01L 21/0217; H01L 21/02266; H01L 21/3221; C23C 14/0652; C23C 14/0036; C23C 14/34

USPC ............. 438/759, 14, 464, 127, 465, 114; 257/E21.599, E23.194

See application file for complete search history.

(56) References Cited

U.S. PATENT DOCUMENTS

| | | | | |
|---|---|---|---|---|
| 7,248,444 | B1 * | 7/2007 | Lauer ..................... | G11B 5/102 360/244.4 |
| 2009/0168253 | A1 * | 7/2009 | Araki ................... | G01R 33/098 360/313 |
| 2012/0289060 | A1 * | 11/2012 | Harada ................. | H01L 21/304 438/759 |
| 2015/0364591 | A1 * | 12/2015 | Lu ..................... | H01L 29/66462 257/194 |

FOREIGN PATENT DOCUMENTS

| | | |
|---|---|---|
| JP | 2006-080329 | 3/2006 |
| JP | 2009-026992 | 2/2009 |
| JP | 2009-117653 | 5/2009 |

\* cited by examiner

*Primary Examiner* — Evan Pert
*Assistant Examiner* — Changhyun Yi
(74) *Attorney, Agent, or Firm* — Greer Burns & Crain Ltd.

(57) ABSTRACT

Disclosed herein is a wafer processing method for processing the back side of a wafer having a plurality of devices formed on the front side so as to be separated by a plurality of crossing division lines. The wafer processing method includes a back grinding step of grinding the back side of the wafer to thereby reduce the thickness of the wafer to a predetermined thickness, a back polishing step of polishing the back side of the wafer after performing the back grinding step, thereby removing grinding strain, and a diamond-like carbon film deposition step of forming a diamond-like carbon film on the back side of the wafer after performing the back polishing step.

2 Claims, 12 Drawing Sheets

WAFER PROCESSING METHOD AND ELECTRONIC DEVICE

BACKGROUND OF THE INVENTION

Field of the Invention

The present invention relates to a wafer processing method which can attain sufficient die strength and a sufficient gettering effect of each device obtained by dividing a wafer.

Description of the Related Art

A plurality of devices such as ICs (Integrated Circuits) and LSIs (Large Scale Integrations) are formed on the front side of a wafer so as to be separated by a plurality of crossing division lines. The back side of the wafer thus having the devices on the front side is ground to reduce the thickness of the wafer to a predetermined thickness. Thereafter, the wafer is divided into individual device chips along the division lines by using a dicing apparatus. The device chips thus divided from the wafer are used in various electronic apparatuses or the like.

Further, a package device called MCP (Multi Chip Package) has also been put into practical use (see Japanese Patent Laid-open No. 2009-26992, for example). This package device is obtained by the steps of grinding the back sides of plural wafers to reduce the thickness of each wafer to 100 [μm] or less and next stacking these wafers to connect the terminals of upper and lower devices of the stacked wafers, thereby improving the function as a whole.

The devices included in the wafer are formed on the front side of a silicon substrate. The back side of the silicon substrate (wafer) is ground to reduce the thickness of the wafer to a predetermined thickness. Thereafter, the wafer is divided into the individual device chips. However, when the back side of the wafer is ground, grinding strain is left on the back side of the wafer to cause a reduction in die strength of each device. To cope with this problem, the back side of the wafer is polished by using a polishing pad after grinding, thereby removing the grinding strain to improve the die strength of each device (see Japanese Patent Laid-open No. 2006-80329, for example). Further, there has also been proposed a technique of forming a silicon nitride film by a plasma CVD (Chemical Vapor Deposition) method or a method of nitriding silicon, thereby forming a gettering layer for capturing heavy metal (see Japanese Patent Laid-open No. 2009-117653, for example).

SUMMARY OF THE INVENTION

However, in the case of forming a silicon nitride film by a plasma CVD method, much time is required to cause a reduction in productivity. Further, in the method of nitriding a silicon substrate to form a silicon nitride film, stress is produced in the silicon substrate to cause warpage of the silicon substrate.

It is therefore an object of the present invention to provide a wafer processing method which can attain a sufficient gettering effect as ensuring the die strength of each device.

In accordance with an aspect of the present invention, there is provided a wafer processing method for processing the back side of a wafer having a plurality of devices formed on the front side so as to be separated by a plurality of crossing division lines, the wafer processing method including a back grinding step of grinding the back side of the wafer to thereby reduce the thickness of the wafer to a predetermined thickness; a back polishing step of polishing the back side of the wafer after performing the back grinding step, thereby removing grinding strain; and a diamond-like carbon film deposition step of forming a diamond-like carbon film on the back side of the wafer after performing the back polishing step. In this wafer processing method, the thickness of the diamond-like carbon film is preferably set to 10 to 100 [nm].

Further, there is also provided an electronic device having a diamond-like carbon film formed on the back side according to the present invention.

According to the wafer processing method of the present invention, the diamond-like carbon film is formed on the back side of the wafer, so that a sufficient gettering effect can be attained as ensuring the die strength of each device. Further, according to the electronic device of the present invention, the diamond-like carbon film is formed on the back side of the device, so that a sufficient gettering effect can be attained as ensuring the die strength of the device.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
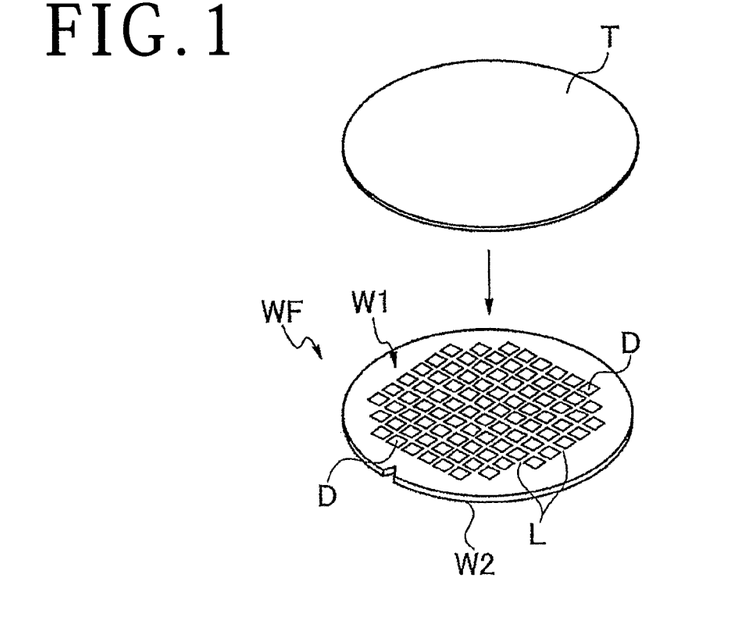
FIG. 1 is a perspective view of a wafer and a protective tape to be attached to the front side of the wafer.

Referring to FIG. 1, there is shown a wafer WF as a workpiece to be processed by the present invention. The wafer WF has a front side W1 and a back side W2. A plurality of crossing division lines L are formed on the front side W1 of the wafer WF to thereby define a plurality of separate regions where a plurality of electronic devices D are formed. There will now be described a wafer processing method including the steps of grinding the back side W2 of the wafer WF, next polishing the ground surface of the wafer WF, and next forming a DLC (Diamond-Like Carbon) film on the polished surface of the wafer WF.

(1) Back Grinding Step

First, a protective tape T is attached to the front side W1 of the wafer WF as shown in FIG. 1. For example, the protective tape T includes a base sheet and an adhesive layer formed on the front side of the base sheet, wherein the base sheet is formed of polyvinyl chloride and the adhesive layer is formed of acrylic resin. The adhesive layer of the protective tape T is attached to the front side W1 of the wafer WF, thereby protecting the front side W1.

Figure 2:
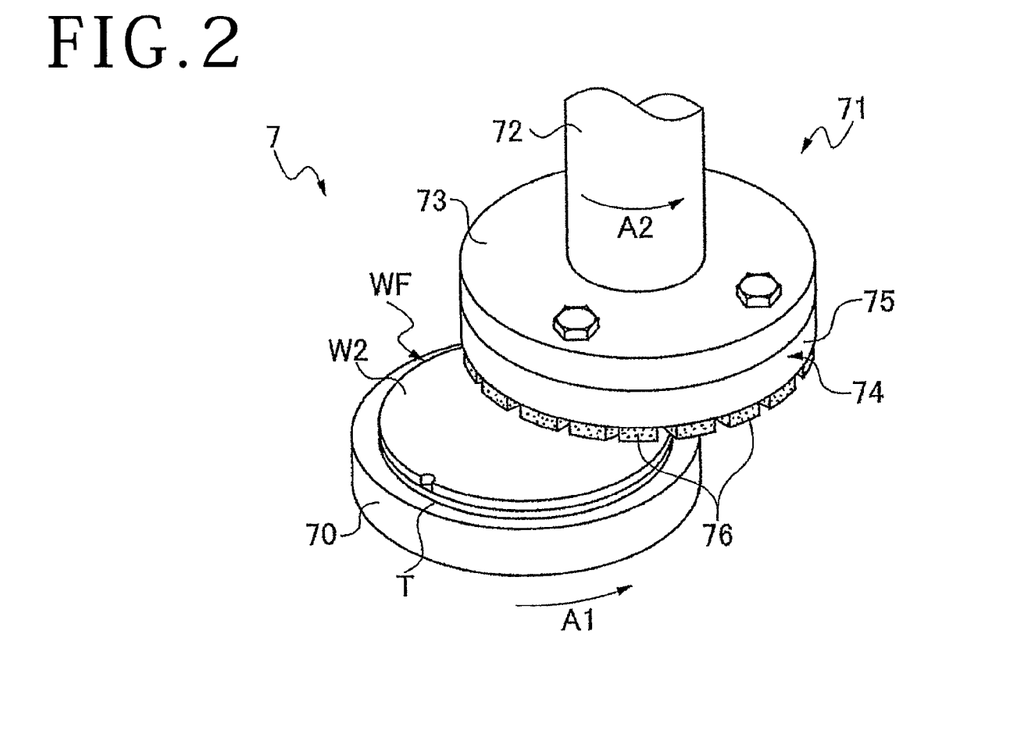
FIG. 2 is a perspective view showing a back grinding step.

Thereafter, the wafer WF with the protective tape T is held under suction on a rotatable chuck table 70 included in a grinding apparatus 7 shown in FIG. 2 in the condition where the protective tape T is in contact with the upper surface of the chuck table 70. Accordingly, the back side W2 of the wafer WF held on the chuck table 70 is exposed. The grinding apparatus 7 includes grinding means 71 for grinding the back side W2 of the wafer WF. The grinding means 72 includes a rotating shaft 72, a mount 73 fixed to the lower end of the rotating shaft 72, and a grinding wheel 74 detachably mounted on the lower surface of the mount 73. The grinding wheel 74 includes a base 75 and a plurality of abrasive members 76 fixed to the lower surface of the base 75 so as to be arranged annularly. Each abrasive member 76 is configured by fixing diamond abrasive grains with a bond.

The grinding apparatus 7 is operated in the following manner. The chuck table 70 is rotated in the direction shown by an arrow A1 in FIG. 2, and the rotating shaft 72 is also rotated in the direction shown by an arrow A2 in FIG. 2. In this condition, the grinding means 71 is lowered to bring the abrasive members 76 into contact with the back side W2 of the wafer WF, thereby grinding the back side W2. During this grinding operation, the locus of rotation of the abrasive members 76 arranged in the form of a ring passes through the center of the wafer WF. When the thickness of the wafer WF is reduced to a predetermined thickness by this grinding operation, the grinding means 71 is raised to end the back grinding step.

(2) Back Polishing Step

Figure 3:
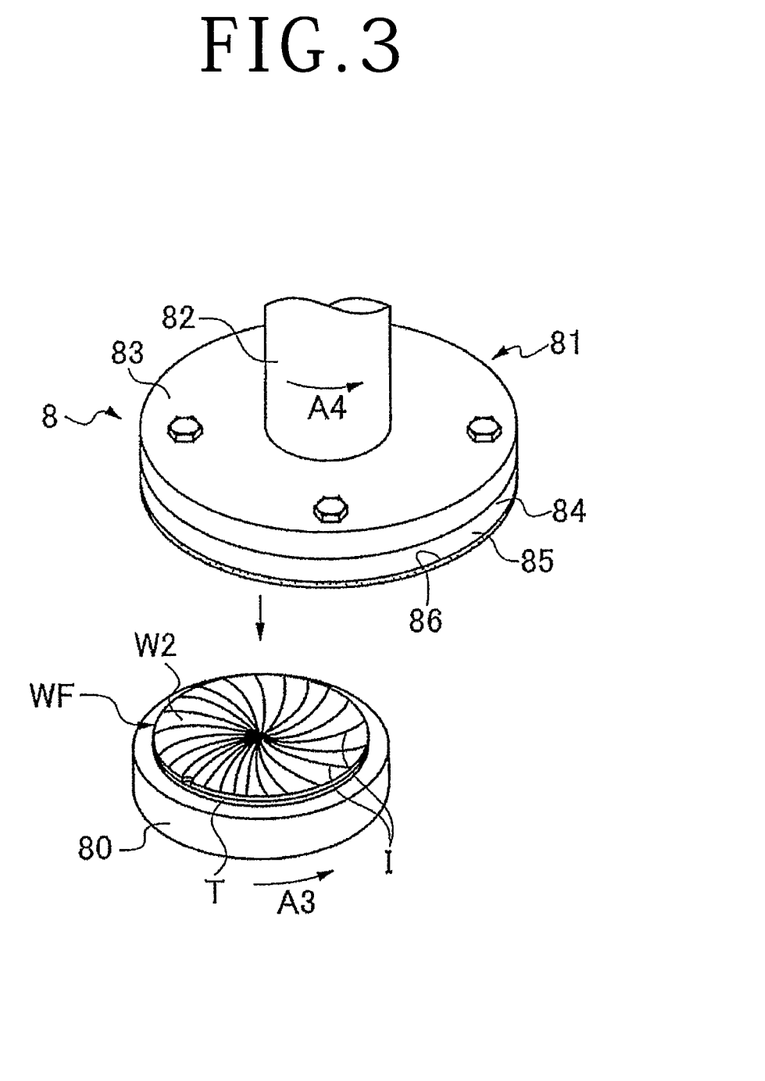
FIG. 3 is a perspective view showing a back polishing step.

After performing the back grinding step, the wafer WF with the protective tape T is transferred to a polishing apparatus 8 shown in FIG. 3. The polishing apparatus 8 includes a rotatable chuck table 80 for holding the wafer WF and polishing means 81 for polishing the back side W2' (ground surface) of the wafer WF. The polishing means 81 includes a rotating shaft 82, a mount 83 fixed to the lower end of the rotating shaft 82, and a polishing wheel 84 detachably mounted on the lower surface of the mount 83. The polishing wheel 84 includes a base 85 and a circular polishing pad 86 fixed to the lower surface of the base 85. For example, the polishing pad 86 is formed of nonwoven fabric or foamed urethane resin. The polishing pad 86 has a diameter larger than that of the wafer WF.

The wafer WF with the protective tape T is held under suction on the chuck table 80 in the condition where the protective tape T is in contact with the upper surface of the chuck table 80. Accordingly, the back side W2' of the wafer WF held on the chuck table 80 is exposed. The polishing apparatus 8 is operated in the following manner. The chuck table 80 is rotated in the direction shown by an arrow A3 in FIG. 3, and the rotating shaft 82 is also rotated in the direction shown by an arrow A4 in FIG. 3. In this condition, the polishing means 81 is lowered to bring the polishing pad 86 into contact with the whole of the back side W2' of the wafer WF, thereby polishing the back side W2'. During this polishing operation, the lower surface of the polishing pad 86 is kept in contact with the whole of the back side W2' of the wafer WF. When grinding strain on the back side W2' of the wafer WF is removed by this polishing operation, the polishing means 81 is raised to end the back polishing step.

As a modification, a single apparatus including both the grinding means 71 shown in FIG. 2 and the polishing means 81 shown in FIG. 3 may be used to sequentially perform the back grinding step and the back polishing step. Further, while the back polishing step is performed by using the polishing pad, the back polishing step may be performed by grinding using a high-mesh wheel, etching, etc.

(3) DLC Film Deposition Step

Figure 4:
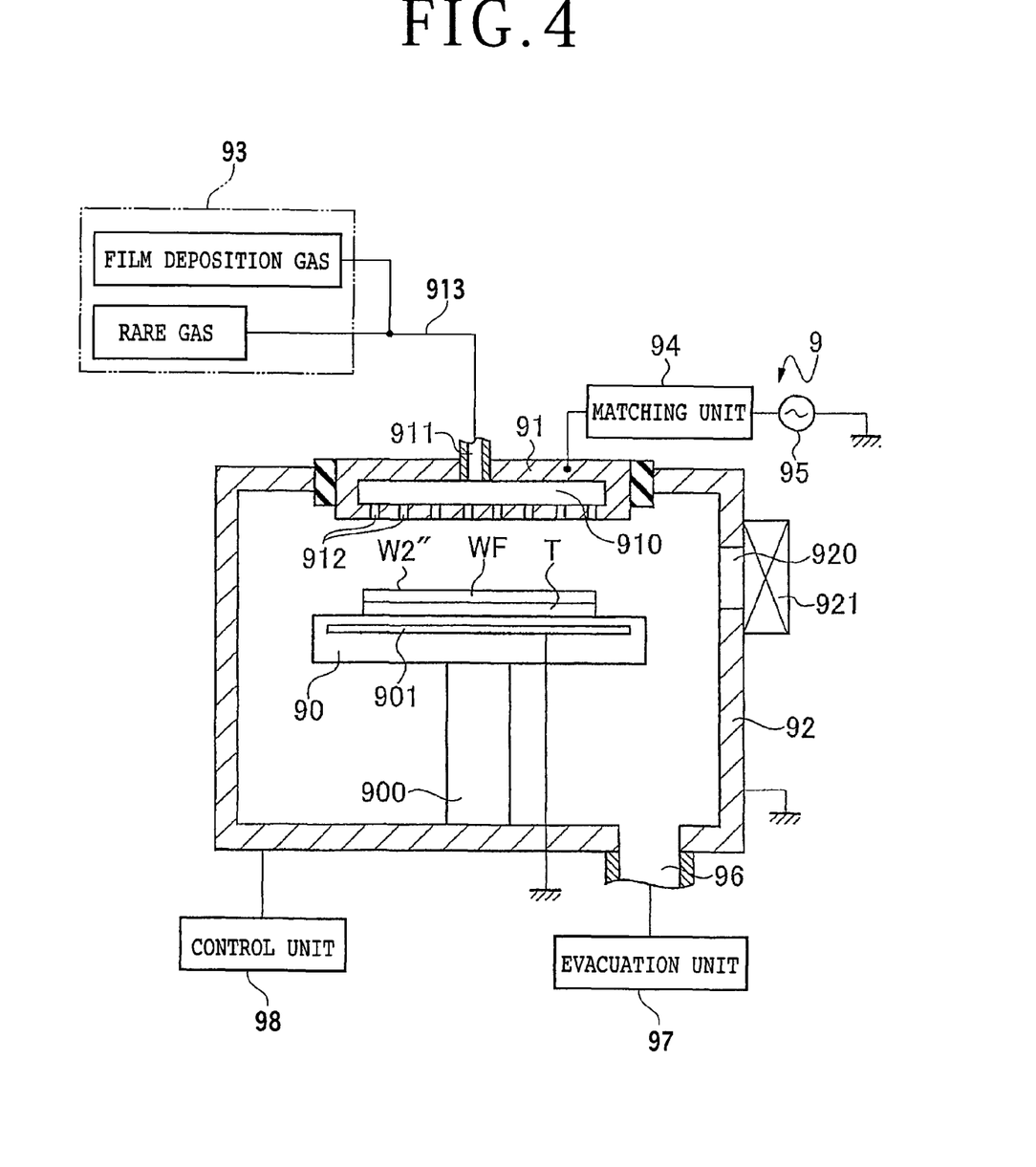
FIG. 4 is a sectional view of a film deposition apparatus usable in performing a DLC (Diamond-Like Carbon) film deposition step.

After performing the back polishing step, the wafer WF with the protective tape T is transferred to a film deposition apparatus 9 shown in FIG. 4. The film deposition apparatus 9 includes a holding table 90 for holding the wafer WF, a gas discharge head 91 for discharging a gas, and a chamber 92 accommodating the holding table 90 and the gas discharge head 91. The holding table 90 is supported from its lower side by a support member 900. An electrode 901 is provided inside the holding table 90. The electrode 901 is grounded.

A gas diffusion space 910 is defined inside the gas discharge head 91. A gas inlet opening 911 is in communication with the upper portion of the gas diffusion space 910, and gas discharge openings 912 are in communication with the lower portion of the gas diffusion space 910. The lower ends of the gas discharge openings 912 are directed toward the holding table 90. A gas supply unit 93 is connected through a gas pipe 913 to the gas inlet opening 911. The gas supply unit 93 includes a portion of storing a film deposition gas and a portion of storing a rare gas.

An RF (Radio Frequency) source 95 is connected through a matching unit 94 to the gas discharge head 91. An RF power is supplied from the RF source 95 through the matching unit 94 to the gas discharge head 91, thereby generating plasma of the gas discharged from the gas discharge openings 912. An evacuation pipe 96 is connected to the lower portion of the chamber 92, and an evacuation unit 97 is connected to the evacuation pipe 96. By operating the evacuation unit 97, the pressure in the chamber 92 can be reduced to a predetermined vacuum.

The side portion of the chamber 92 is provided with a load/unload opening 920 for loading and unloading the wafer WF and a gate valve 921 for closing the load/unload opening 920. The film deposition apparatus 9 includes a control unit 98 for controlling various conditions including the discharge amount and time for each gas and the RF power to be applied.

In performing the DLC film deposition step, the gate valve 921 is opened to load the wafer WF from the load/unload opening 920. After closing the gate valve 921, the chamber 92 is evacuated by the evacuation unit 97 to thereby reduce the pressure in the chamber 92 to 0.10 to 0.15 [Pa], for example. Further, the film deposition gas stored in the gas supply unit 93 is supplied through the gas pipe 913 and the gas inlet opening 911 to the gas diffusion space 910 and then discharged from the gas discharge openings 912. For example, toluene ($C_7H_8$) is used as the film deposition gas. Any hydrocarbon gases such as $C_2H_2$, $C_4H_6$, and $C_6H_6$ other than toluene ($C_7H_8$) may also be used as the film deposition gas. Further, any gases (CxHyOz) containing carbon, hydrogen, and oxygen, such as $C_4H_4O$ and $C_4H_8O$ may also be used as the film deposition gas.

As described above, the film deposition gas is introduced into the chamber 92. Further, the temperature of the holding table 90 is set to 70° C. or lower, which is a temperature where the protective tape T is not deformed. Further, RF power (e.g., frequency: 13.56 [MHz] (parallel plate type), power: 1 [kW]) is applied from the RF source 95 to the gas discharge head 91, thereby producing an RF field between the gas discharge head 91 and the holding table 90 to generate the plasma of the film deposition gas. As a result, DLC (Diamond-Like Carbon) as a kind of amorphous carbon is deposited on the back side W2" (polished surface) of the wafer WF. Such deposition is performed for a predetermined period of time to thereby form an amorphous carbon film having a predetermined thickness on the back side W2".

During this film deposition, a rare gas such as Ar as a diluting gas may be supplied in addition to the film deposition gas from the gas supply unit 93. Plasma of the rare gas functions to sputter the back side W2" of the wafer WF, thereby removing organic matter deposited to the back side W2" of the wafer WF to clean the back side W2". Further, a rare gas such as He functions to assist the generation of the plasma of the film deposition gas, so that the generation of the plasma of the film deposition gas can be accelerated by the rare gas. Thus, helium (He), argon (Ar), etc. as the rare gas may be used according to purposes. Further, the supply of the rare gas into the chamber 92 may be conducted before the supply of the film deposition gas.

In the case of using a gas containing oxygen as the film deposition gas, an oxygen plasma generated functions to remove a weak portion of the DLC film during the film deposition, so that a denser DLC film can be formed. Further, by controlling the amount of hydrogen contained in the film deposition gas, the hardness of the DLC film can be controlled.

After performing the DLC film deposition step, the wafer WF may be divided into individual chips along the division lines L shown in FIG. 1 by a known method using a cutting blade or a laser beam, for example. In this case, the wafer WF may be fully cut by using the cutting blade or applying the laser beam. Alternatively, the wafer WF may be half cut by using the cutting blade or applying the laser beam, and an external force may be next applied to the wafer WF to divide the wafer WF into the individual chips. As a modification, the laser beam may be applied along each division line L to thereby form a modified layer inside the wafer WF, and an external force may be next applied to the wafer WF to divide the wafer WF into the individual chips.

While the DLC film is formed on the back side W2" of the wafer WF before dividing the wafer WF into the individual chips in the above description, the DLC film may be formed on the back side of each chip after dividing the wafer WF into the individual chips. Various methods for conducting this case will now be described as first to third preferred embodiments.

[First Preferred Embodiment]

(1-1) Modified Layer Forming Step

Figure 5:
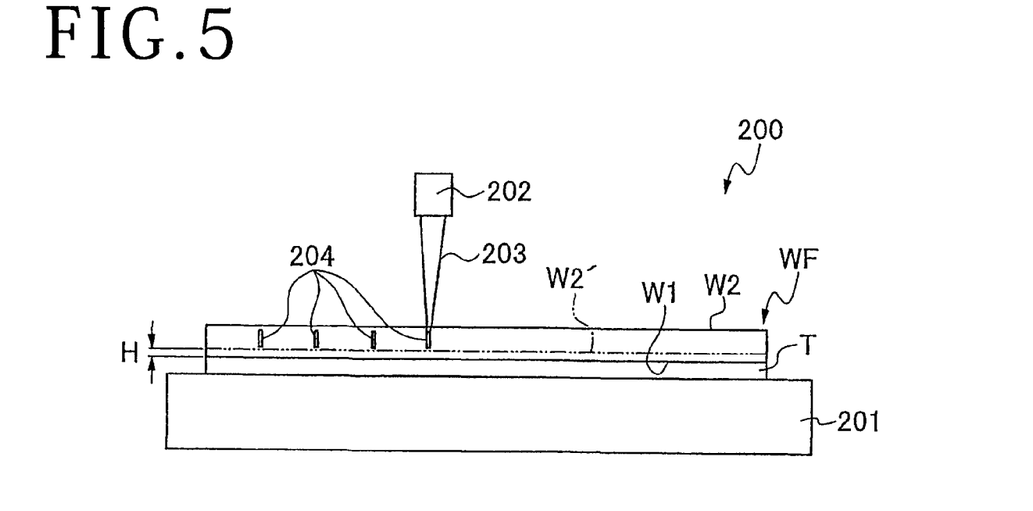
FIG. 5 is a sectional view showing a modified layer forming step according to a first preferred embodiment of the present invention.

As shown in FIG. 5, the protective tape T is first attached to the front side W1 of the wafer WF. Thereafter, the wafer WF with the protective tape T is held on a holding table 201 included in a laser processing apparatus 200 in the condition where the protective tape T is in contact with the upper surface of the holding table 201. Accordingly, the back side W2 of the wafer WF held on the holding table 201 is exposed.

Thereafter, a laser beam 203 having a transmission wavelength to the wafer WF is applied from a laser head 202 to the back side W2 of the wafer WF in the condition where the focal point of the laser beam 203 is set inside the wafer WF in an area corresponding to each division line L shown in FIG. 1. The laser beam 203 is scanned along each division line L to thereby form a modified layer 204 inside the wafer WF along each division line L. Each modified layer 204 is formed in a portion to be removed by back grinding to be performed later. For example, in the case that the final finished thickness of the wafer WF is H as shown in FIG. 5, the lower end of each modified layer 204 is set just above the vertical position higher than the front side W1 by the height H. In this manner, the plural modified layers 204 are formed inside the wafer WF along all of the division lines L.

(1-2) Back Grinding Step

Figure 6:
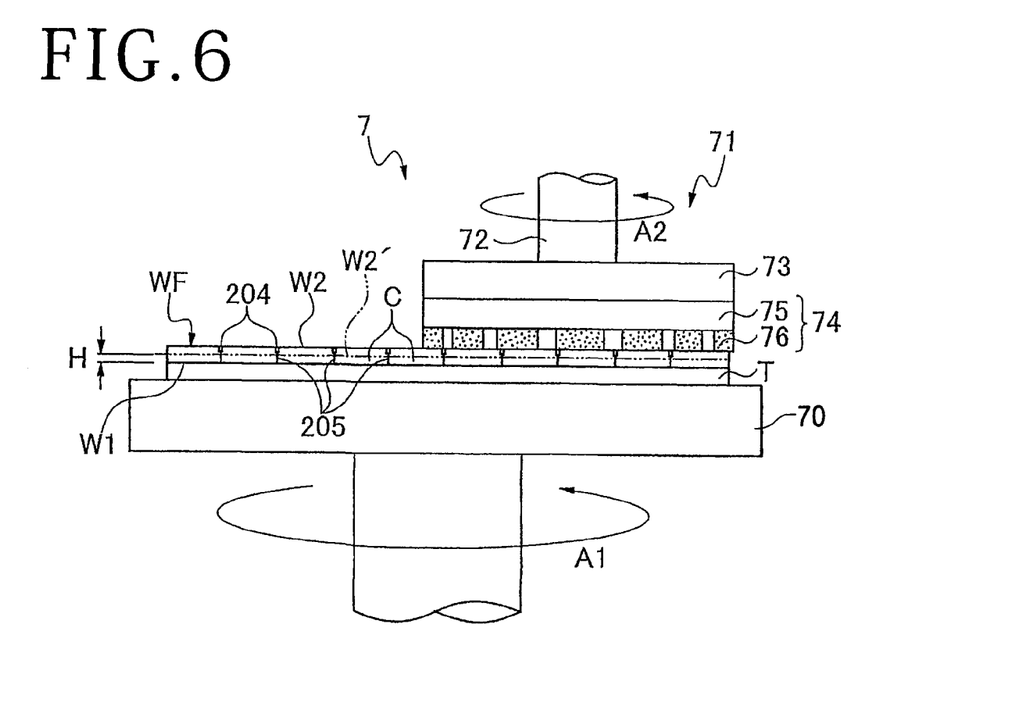
FIG. 6 is a sectional view showing a back grinding step according to the first preferred embodiment.

After performing the modified layer forming step, a back grinding step is performed by using a grinding apparatus 7 shown in FIG. 6, which is the same as that shown in FIG. 2. As shown in FIG. 6, the wafer WF with the protective tape T is held on the chuck table 70 of the grinding apparatus 7 in the condition where the protective tape T is in contact with the upper surface of the chuck table 70. In this condition, the chuck table 70 is rotated in the direction shown by an arrow A1 in FIG. 6, and the grinding wheel 74 is also rotated in the direction shown by an arrow A2 in FIG. 6. Further, the grinding means 71 is lowered to bring the abrasive members 76 into contact with the back side W2 of the wafer WF, thereby grinding the back side W2. As a result, a crack 205 is formed so as to extend from the lower end of each modified layer 204 toward the front side W1 of the wafer WF, thereby dividing the wafer WF into individual chips C along the division lines L. The back side W2 of the wafer WF is ground until the back side W2' is exposed to leave the thickness H of the wafer WF (each chip C). That is, when the thickness of the wafer WF (each chip C) is reduced to the finished thickness H by this grinding operation, the grinding means 71 is raised to end the back grinding step.

(1-3) Back Polishing Step

Figure 7:
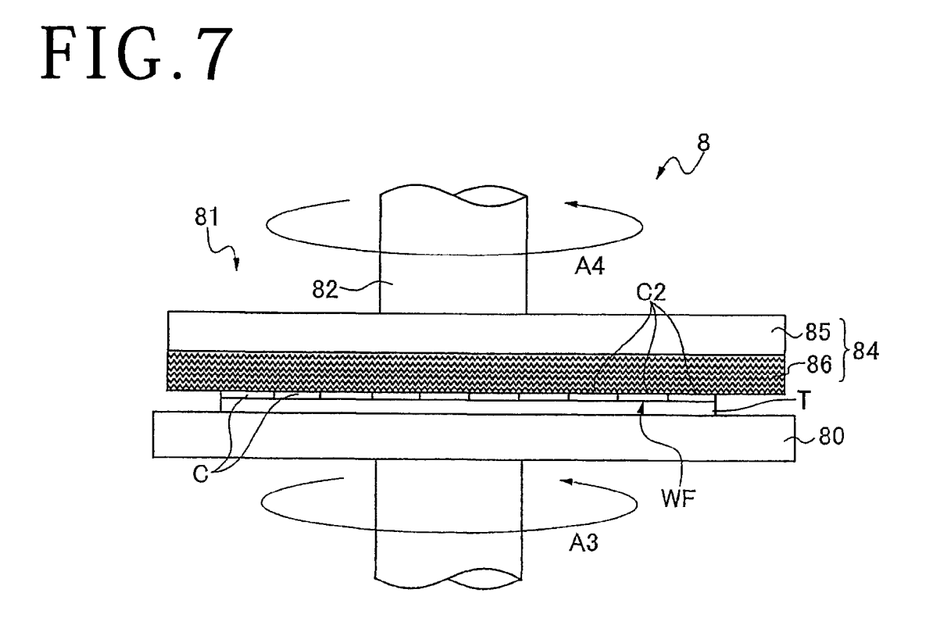
FIG. 7 is a sectional view showing a back polishing step according to the first preferred embodiment.

After performing the back grinding step, a back polishing step is performed by using a polishing apparatus 8 shown in FIG. 7, which is the same as that shown in FIG. 3. As shown in FIG. 7, the wafer WF (each chip C) with the protective tape T is held on the chuck table 80 of the polishing apparatus 8 in the condition where the protective tape T is in contact with the upper surface of the chuck table 80. In this condition, the chuck table 80 is rotated in the direction shown by an arrow A3 in FIG. 7, and the polishing wheel 84 is also rotated in the direction shown by an arrow A4 in FIG. 7. Further, the polishing means 81 is lowered to bring the polishing pad 86 into contact with the back side C2 of each chip C, thereby polishing the back side C2 to remove the grinding strain.

In the case that the cracks 205 are not formed in the back grinding step, similar cracks may be formed in this back polishing step to divide the wafer WF into the individual chips C. Further, while the back polishing step is performed by using the polishing pad, the back polishing step may be performed by grinding using a high-mesh wheel, etching, etc.

(1-4) DLC Film Deposition Step

Figure 8:
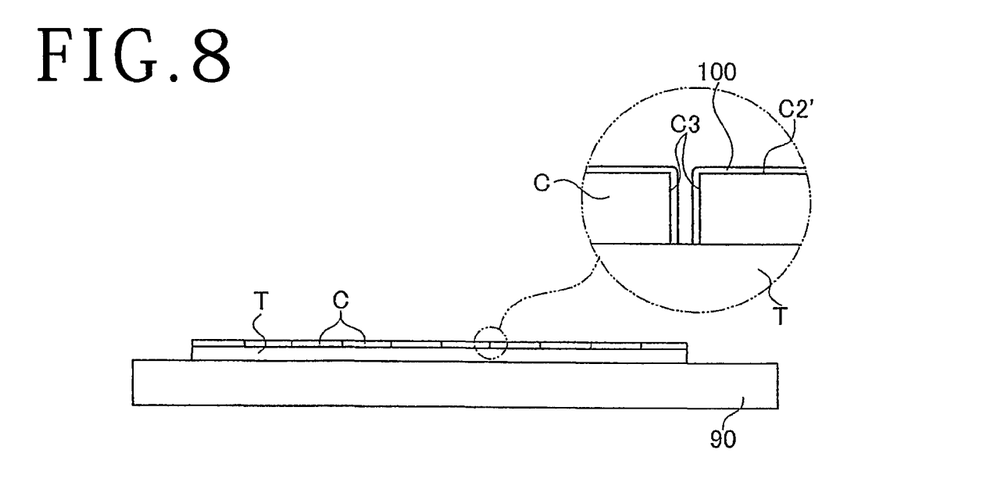
FIG. 8 is a sectional view showing a DLC film deposition step according to the first preferred embodiment.

After performing the back polishing step, a DLC film 100 is formed on the back side C2' (polished surface) of each chip C as shown in FIG. 8. The DLC film 100 is formed by a method similar to the method of forming a DLC film on the back side W2'' of the wafer WF by using the film deposition apparatus 9 shown in FIG. 4. The modified layer on the side wall of each chip is removed by the back grinding step, and/or the grinding strain on the back side of each chip is removed by the back polishing step, so that a gettering effect may disappear from the side wall and the back side of each chip. Accordingly, it is effective to form the DLC film on the side wall and the back side of each chip, thereby obtaining a gettering effect.

Unlike the case of forming a DLC film on the back side of the wafer WF, the DLC film 100 is also formed on the side surface C3 of each chip C because a spacing is defined between the adjacent chips C as shown in FIG. 8. The modified layers 204 shown in FIGS. 5 and 6 have a gettering effect and they are removed by the back grinding step, so that the gettering effect disappears. However, since the DLC film 100 is formed on the back side C2' and the side surface C3 of each chip C by performing this DLC film deposition step, a gettering effect can be produced on each chip C.

Figure 9:
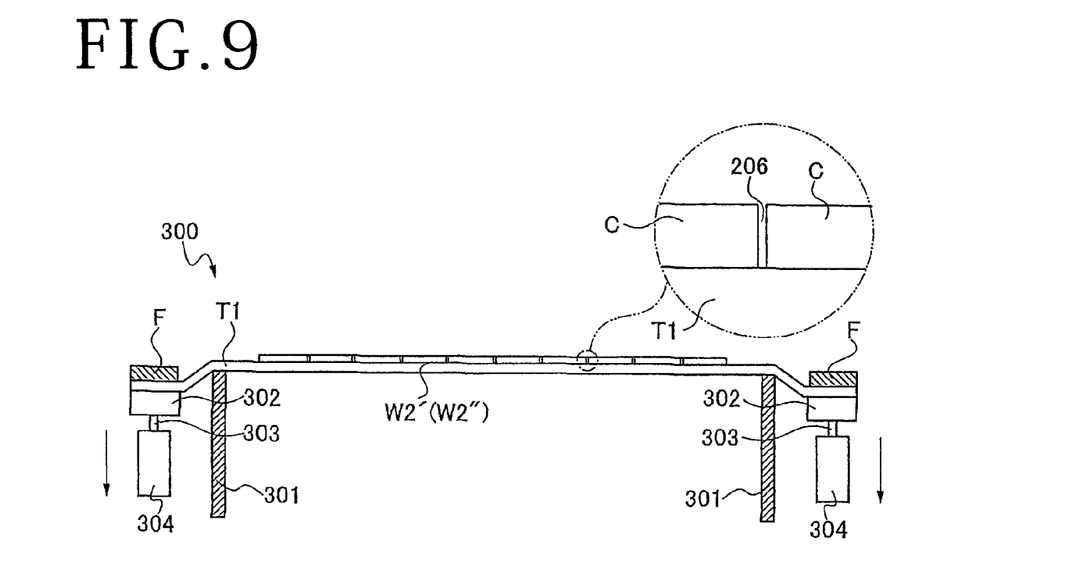
FIG. 9 is a sectional view showing an expanding step according to the first preferred embodiment.

In the case that the cracks 205 shown in FIG. 6 do not reach the front side W1 of the wafer WF and the wafer WF is not divided into the individual chips C in the back grinding step or the back polishing step, an expanding step shown in FIG. 9 is performed after performing the back grinding step or the back polishing step. As shown in FIG. 9, this expanding step is performed by using an expanding apparatus 300. First, an expanding tape T1 is attached to the back side W2' or W2'' of the wafer WF, and an annular frame F is attached to the peripheral portion of the expanding tape T1. The expanding apparatus 300 includes a cylindrical holding drum 301 for holding the wafer WF and an annular frame support 302 provided around the holding drum 301 for supporting the annular frame F. The wafer WF with the expanding tape T1 is held on the holding drum 301 in the condition where the expanding tape T1 is in contact with the upper end of the holding drum 301. Further, the annular frame F is placed on the frame support 302 and fixed thereto by any fixing means (not shown). The frame support 302 is fixed to a plurality of pistons 303, which are operatively connected to a plurality of cylinders 304. Accordingly, the frame support 302 is vertically moved by operating the cylinders 304 to vertically move the pistons 303.

When the frame support 302 on which the annular frame F is fixedly supported is lowered, the expanding tape T1 is expanded to thereby form a division groove 206 along each division line, thus dividing the wafer WF into the individual chips C. In the case that the wafer WF is not divided even by this expanding step, the back grinding step or the back polishing step may be performed again and then followed by the expanding step.

[Second Preferred Embodiment]

(2-1) Back Grinding Step

Figure 10:
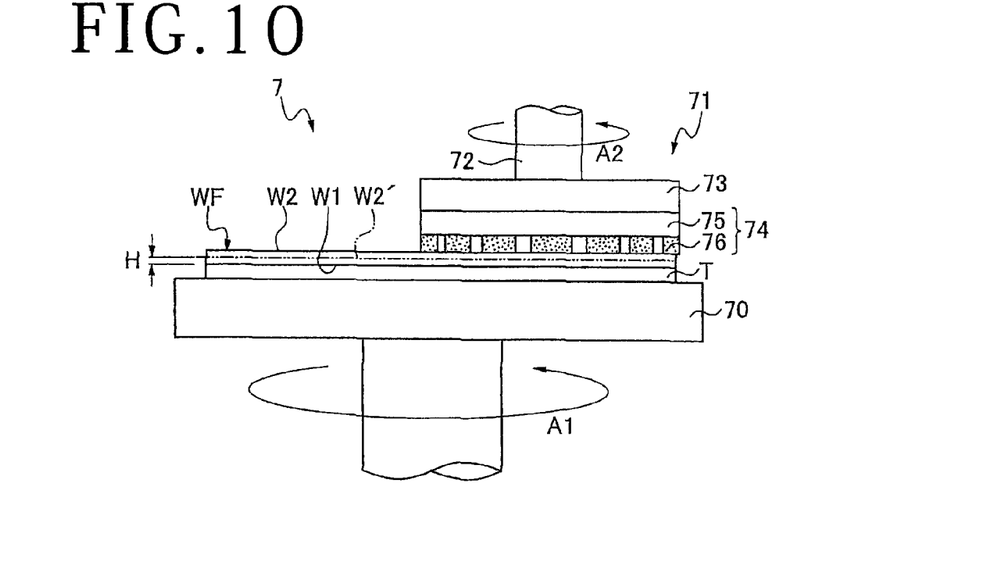
FIG. 10 is a sectional view showing a back grinding step according to a second preferred embodiment of the present invention.

As shown in FIG. 10, the protective tape T is first attached to the front side W1 of the wafer WF. Thereafter, the wafer WF with the protective tape T is held on the chuck table 70 of the grinding apparatus 7 shown in FIG. 2 in the condition where the protective tape T is in contact with the upper surface of the chuck table 70. In this condition, the chuck table 70 is rotated in the direction shown by an arrow A1 in FIG. 10, and the grinding wheel 74 is also rotated in the direction shown by an arrow A2 in FIG. 10. Further, the grinding means 71 is lowered to bring the abrasive members 76 into contact with the back side W2 of the wafer WF, thereby grinding the back side W2. When the back side W2 of the wafer WF is ground until the back side W2' is exposed, thereby reducing the thickness of the wafer WF to the predetermined thickness H, the grinding means 71 is raised to end the back grinding step.

(2-2) Modified Layer Forming Step

Figure 11:
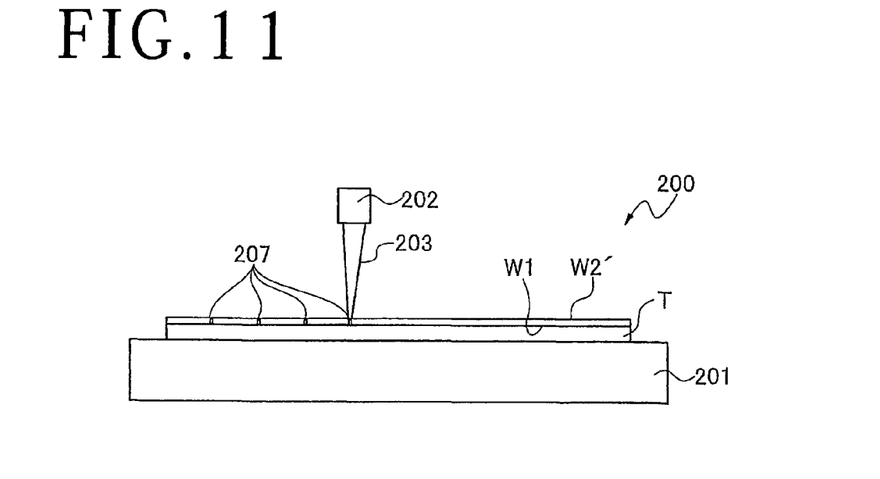
FIG. 11 is a sectional view showing a modified layer forming step according to the second preferred embodiment.

After performing the back grinding step, the wafer WF with the protective tape T is held on the holding table 201 of the laser processing apparatus 200 in the condition where the protective tape T is in contact with the upper surface of the holding table 201 as shown in FIG. 11. Accordingly, the back side W2' (ground surface) of the wafer WF held on the holding table 201 is exposed. Thereafter, a laser beam 203 having a transmission wavelength to the wafer WF is applied from the laser head 202 to the back side W2' of the wafer WF in the condition where the focal point of the laser beam 203 is set inside the wafer WF in an area corresponding to each division line L shown in FIG. 1. The laser beam 203 is scanned along each division line L to thereby form a modified layer 207 inside the wafer WF along each division line L. In this manner, the plural modified layers 207 are formed inside the wafer WF along all of the division lines L.

(2-3) Back Polishing Step

Figure 12:
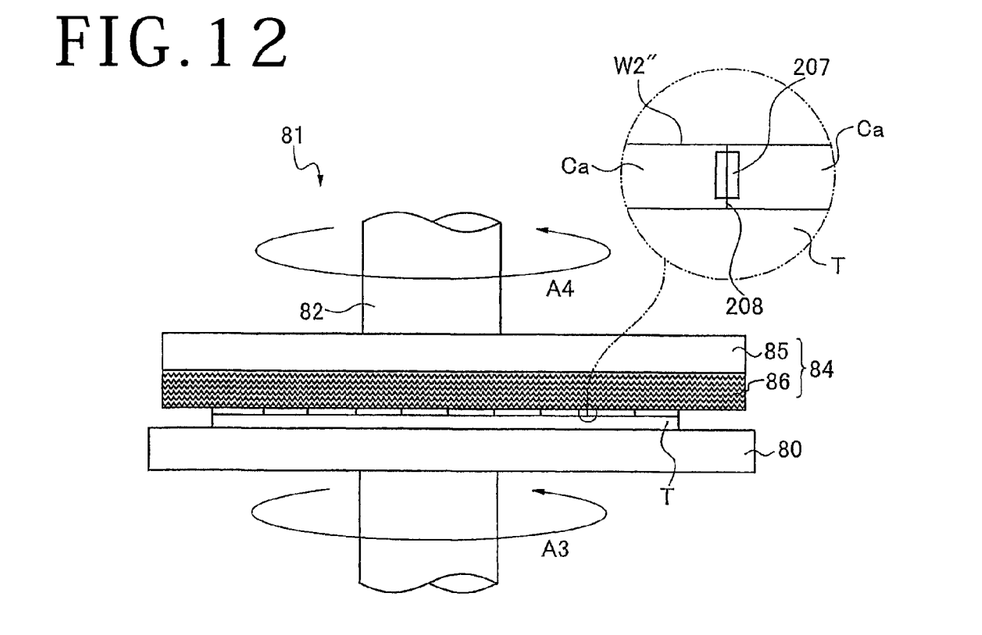
FIG. 12 is a sectional view showing a back polishing step according to the second preferred embodiment.

After performing the modified layer forming step, the wafer WF with the protective tape T is held on the chuck table 80 of the polishing apparatus 8 in the condition where the protective tape T is in contact with the upper surface of the chuck table 80 as shown in FIG. 12. In this condition, the chuck table 80 is rotated in the direction shown by an arrow A3 in FIG. 12, and the polishing wheel 84 is also rotated in the direction shown by an arrow A4 in FIG. 12. Further, the polishing means 81 is lowered to bring the polishing pad 86 into contact with the back side W2' of the wafer WF, thereby polishing the back side W2' to remove the grinding strain. By performing this polishing operation, a crack 208 is formed so as to extend from each modified layer 207, thereby dividing the wafer WF into individual chips Ca as shown in FIG. 12. In the case that each modified layer 207 is formed at a vertical position where it can be removed in the back polishing step, the modified layer 207 is not left on each chip Ca, thereby preventing a reduction in die strength. Further, while the back polishing step is performed by using the polishing pad 86, the back polishing step may be performed by grinding using a high-mesh wheel, etching, etc.

(2-4) Expanding Step

Figure 13:
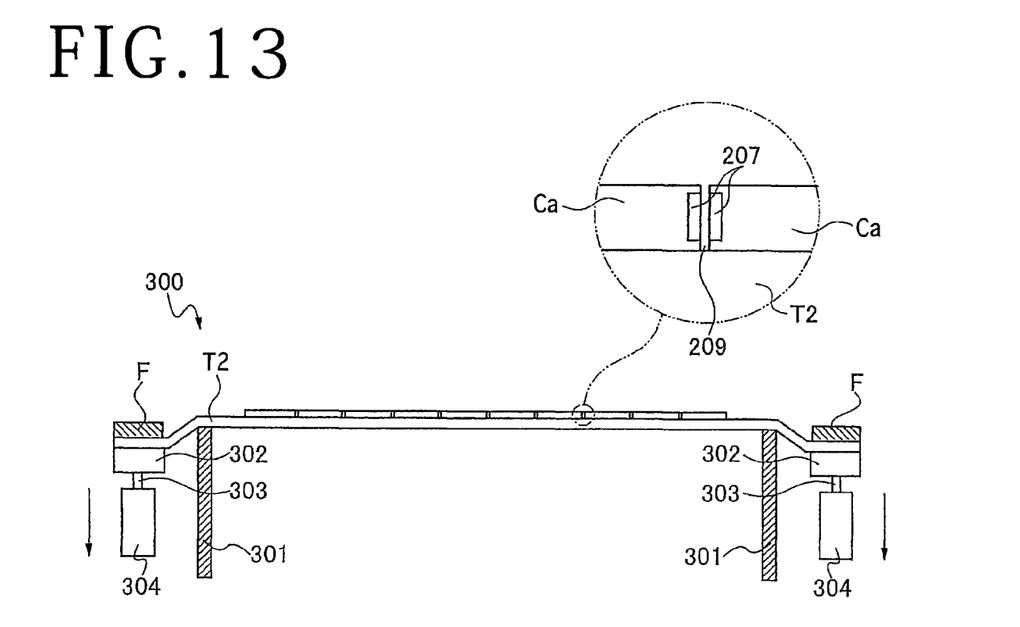
FIG. 13 is a sectional view showing an expanding step according to the second preferred embodiment.

In the case that the cracks 208 shown in FIG. 12 are not formed and the wafer WF is not divided into the individual chips Ca in the back polishing step, an expanding step shown in FIG. 13 is performed after performing the back polishing step. As shown in FIG. 13, this expanding step is performed by using an expanding apparatus 300, which is the same as that shown in FIG. 9. First, an expanding tape 12 is attached to the back side W2'' (polished surface) of the wafer WF, and an annular frame F is attached to the peripheral portion of the expanding tape 12. The wafer WF with the expanding tape T2 is held on the holding drum 301 in the condition where the expanding tape T2 is in contact with the upper end of the holding drum 301. Further, the annular frame F is placed on the frame support 302 and fixed thereto by the fixing means. The frame support 302 is fixed to the pistons 303 operatively connected to the cylinders 304. Accordingly, the frame support 302 is vertically moved by operating the cylinders 304 to vertically move the pistons 303.

When the frame support 302 on which the annular frame F is fixedly supported is lowered, the expanding tape 12 is expanded to thereby form a division groove 209 along each division line where the modified layer 207 is formed as a division start point, thus dividing the wafer WF into the individual chips Ca. In the case that the wafer WF is not divided even by the expanding step, the back polishing step may be performed again and then followed by the expanding step.

(2-5) DLC Film Deposition Step

Figure 14:
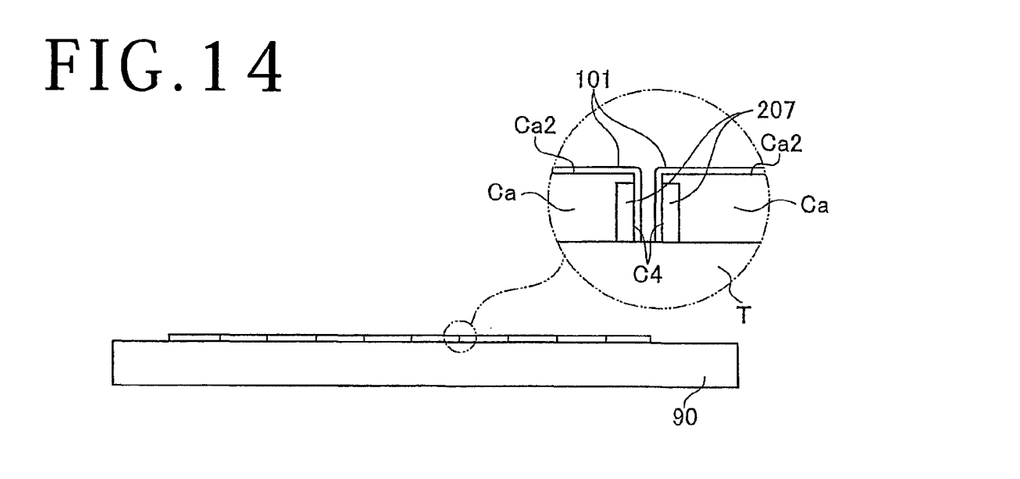
FIG. 14 is a sectional view showing a DLC film deposition step according to the second preferred embodiment.

After performing the back polishing step or the expanding step, a DLC film 101 is formed on the back side Ca2 (polished surface) of each chip Ca as shown in FIG. 14. The DLC film 101 is formed by a method similar to the method of forming a DLC film on the back side W2" of the wafer WF by using the film deposition apparatus 9 shown in FIG. 4. The grinding strain on the back side of each chip is removed by the back polishing step, so that a gettering effect may disappear from the back side of each chip. Accordingly, it is effective to form the DLC film on the back side of each chip, thereby obtaining a gettering effect.

The DLC film 101 is also formed on the side surface C4 of each chip Ca because spacing is defined between the adjacent chips Ca as shown in FIG. 14. Thus, the DLC film 101 is also formed on the side surface C4 of each chip Ca, so that the gettering effect of each chip Ca can be increased.

[Third Preferred Embodiment]

(3-1) Back Grinding Step

First, the protective tape T is attached to the front side W1 of the wafer WF. Thereafter, the wafer WF with the protective tape T is held on the chuck table 70 of the grinding apparatus 7 shown in FIG. 2 in the condition where the protective tape T is in contact with the upper surface of the chuck table 70 as shown in FIG. 10. In this condition, the chuck table 70 is rotated in the direction of the arrow A1, and the grinding wheel 74 is also rotated in the direction of the arrow A2. Further, the grinding means 71 is lowered to bring the abrasive members 76 into contact with the back side W2 of the wafer WF, thereby grinding the back side W2. When the back side W2 of the wafer WF is ground until the back side W2' is exposed, thereby reducing the thickness of the wafer WF to the predetermined thickness H, the grinding means 71 is raised to end the back grinding step.

(3-2) Grooving Step

Figure 15:
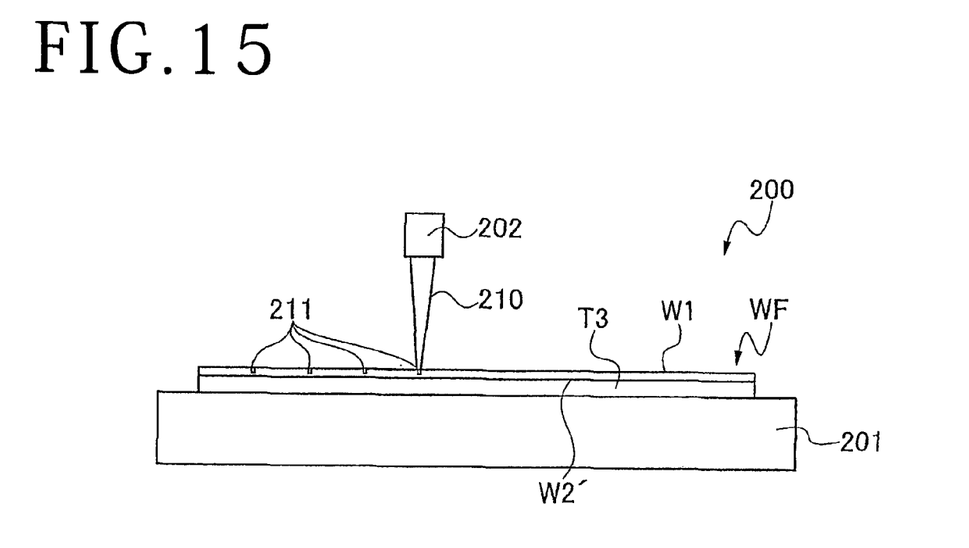
FIG. 15 is a sectional view showing a grooving step by laser processing according to a third preferred embodiment of the present invention.

After performing the back grinding step, a grooving step is performed in the following manner. As shown in FIG. 15, the protective tape T is peeled from the front side W1 of the wafer WF, and a tape T3 is attached to the back side W2' of the wafer WF. Thereafter, the wafer WF with the tape T3 is held on the holding table 201 of the laser processing apparatus 200 in the condition where the tape T3 is in contact with the upper surface of the holding table 201. Accordingly, the front side W1 of the wafer WF held on the holding table 201 is exposed. Thereafter, a laser beam 210 having an absorption wavelength to the wafer WF is applied from the laser head 202 to the front side W1 of the wafer WF in the condition where the focal point of the laser beam 210 is set on the front side W1 in an area corresponding to each division line L. The laser beam 210 is scanned along each division line L to thereby form a laser processed groove 211 on the front side W1 of the wafer WF along each division line L. In this manner, the plural laser processed grooves 211 are formed on the front side W1 of the wafer WF along all of the division lines L.

Figure 16:
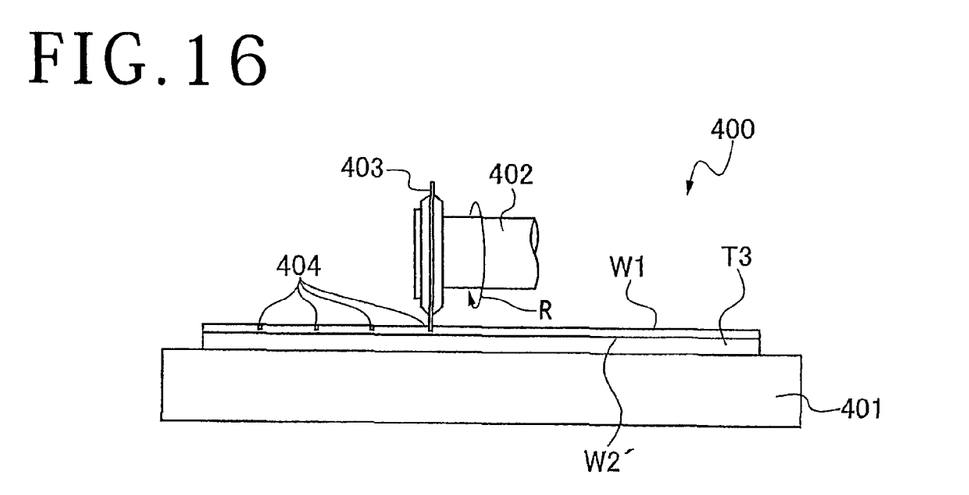
FIG. 16 is a sectional view showing a grooving step by cutting as an alternative to the grooving step shown in FIG. 15.

This grooving step may be performed by using a cutting apparatus 400 shown in FIG. 16. The cutting apparatus 400 includes a chuck table 401, a spindle 402, and a cutting blade 403 mounted on the spindle 402. The wafer WF with the tape T3 is held on the chuck table 401 of the cutting apparatus 400 in the condition where the tape T3 is in contact with the upper surface of the chuck table 401. In this condition, the spindle 402 is rotated to rotate the cutting blade 403 in the direction shown by an arrow R in FIG. 16. At the same time, the cutting blade 403 is lowered to cut in the front side W1 of the wafer WF in an area corresponding to each division line L. The cutting blade 403 is relatively moved along each division line L to thereby form a cut groove 404 on the front side W1 of the wafer WF along each division line L. At this time, the depth of cut by the cutting blade 403 is controlled to a predetermined depth so that the cutting blade 403 does not reach the back side W2' of the wafer WF. Accordingly, the cut groove 404 having the predetermined depth is formed on the front side W1 of the wafer WF along each division line L. In this manner, the plural cut grooves 404 are formed on the front side W1 of the wafer WF along all of the division lines L.

As a modification, a dicing tape may be used as the tape T3 to be attached to the back side W2' of the wafer WF in the laser processing apparatus 200 or the cutting apparatus 400. In this case, a ring frame may be attached to the peripheral portion of the dicing tape, thereby supporting the wafer WF through the dicing tape to the ring frame.

(3-3) Back Polishing Step

Figure 17:
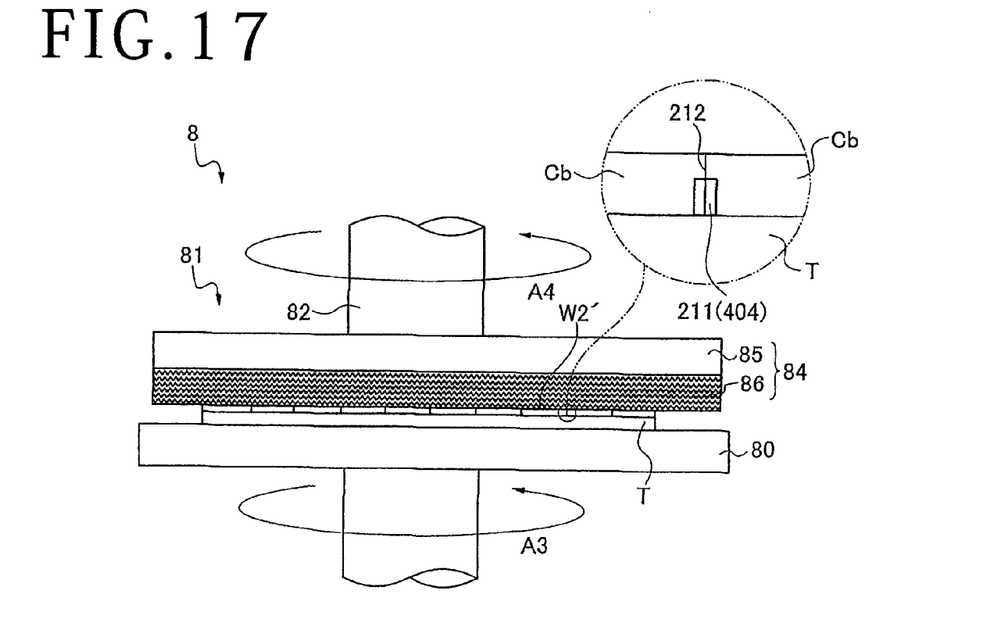
FIG. 17 is a sectional view showing a back polishing step according to the third preferred embodiment.

After performing the grooving step, the tape 13 is peeled from the back side W2' of the wafer WF, and the protective tape T is attached again to the front side W1 of the wafer WF as shown in FIG. 17. Thereafter, the wafer WF with the protective tape T is held on the chuck table 80 of the polishing apparatus 8 in the condition where the protective tape T is in contact with the upper surface of the chuck table 80 as shown in FIG. 17. In this condition, the chuck table 80 is rotated in the direction shown by an arrow A3 in FIG. 17, and the polishing wheel 84 is also rotated in the direction shown by an arrow A4 in FIG. 17. Further, the polishing means 81 is lowered to bring the polishing pad 86 into contact with the back side W2' of the wafer WF, thereby polishing the back side W2' to remove the grinding strain. By performing this polishing operation, a crack 212 is formed so as to extend from each laser processed groove 211 (or each cut groove 404), thereby dividing the wafer WF into individual chips Cb as shown in FIG. 17. Further, while the back polishing step is performed by using the polishing pad, the back polishing step may be performed by grinding using a high-mesh wheel, etching, etc.

(3-4) Expanding Step

Figure 18:
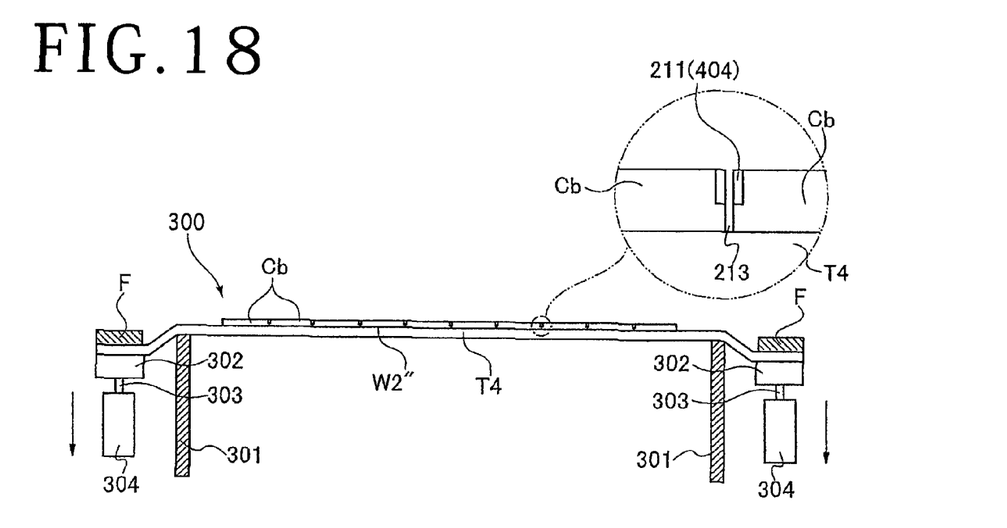
FIG. 18 is a sectional view showing an expanding step according to the third preferred embodiment.

In the case that the wafer WF is not divided into the individual chips Cb in the back polishing step, an expanding step shown in FIG. 18 is performed after performing the back polishing step. As shown in FIG. 18, an expanding tape 14 is attached to the back side W2" (polished surface) of the wafer WF, and an annular frame F is attached to the peripheral portion of the expanding tape 14. The wafer WF with the expanding tape T4 is held on the holding drum 301 in the condition where the expanding tape T4 is in contact with the upper end of the holding drum 301. Further, the annular frame F is placed on the frame support 302 and fixed thereto by the fixing means. The frame support 302 is fixed to the pistons 303 operatively connected to the cylinders 304. Accordingly, the frame support 302 is vertically moved by operating the cylinders 304 to vertically move the pistons 303.

When the frame support 302 on which the annular frame F is fixedly supported is lowered, the expanding tape 14 is expanded to thereby form a division groove 213 along each division line where the laser processed groove 211 (or the cut groove 404) is formed as a division start point, thus dividing the wafer WF into the individual chips Cb. In the case that the wafer WF is not divided even by the expanding step, the back polishing step may be performed again and then followed by the expanding step.

(3-5) DLC Film Deposition Step

Figure 19:
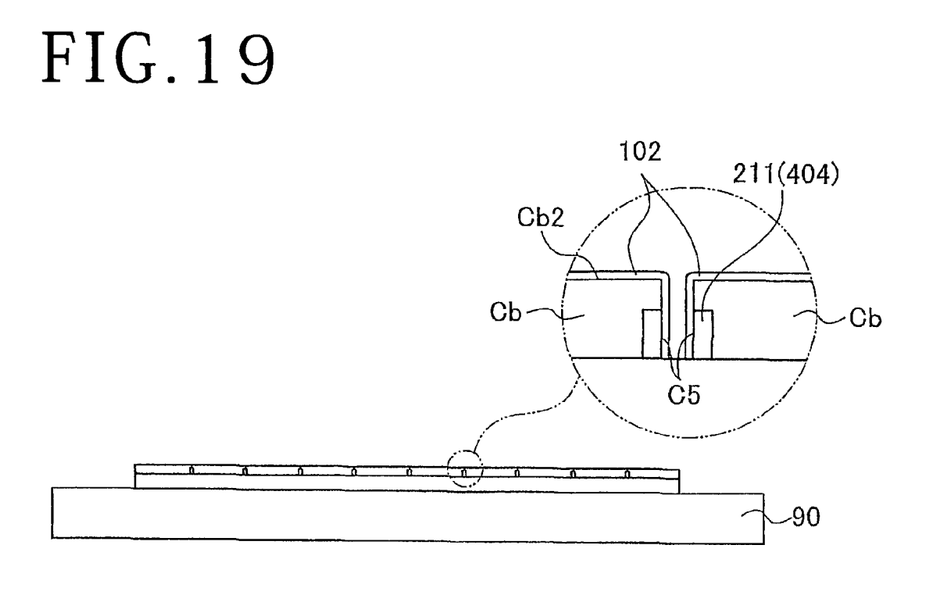
FIG. 19 is a sectional view showing a DLC film deposition step according to the third preferred embodiment.

After performing the back polishing step or the expanding step, a DLC film 102 is formed on the back side Cb2 (polished surface) of each chip Cb as shown in FIG. 19. The DLC film 102 is formed by a method similar to the method of forming a DLC film on the back side W2" of the wafer WF by using the film deposition apparatus 9 shown in FIG. 4. The DLC film 102 is also formed on the side surface C5 of each chip Cb because spacing is defined between the adjacent chips Cb as shown in FIG. 19. Thus, the DLC film 102 is also formed on the side surface C5 of each chip Cb, so that the gettering effect of each chip Cb can be increased.

In the third preferred embodiment, the grooving step may be performed before performing the back grinding step.

A test for determining the thickness of the DLC film was carried out to properly obtain the gettering effect of each device. More specifically, after performing the back grinding step and the back polishing step to a plurality of wafers, a plurality of DLC films having different thicknesses were formed on the back sides of these wafers. Thereafter, these wafers were forcibly contaminated with copper to measure the gettering effect. Then, the relation between the thickness of the DLC film and the gettering effect was considered. Further, in addition to such a gettering effect test, a die strength test was also carried out. In these tests, the following wafer was used as each wafer.

Figure 20:
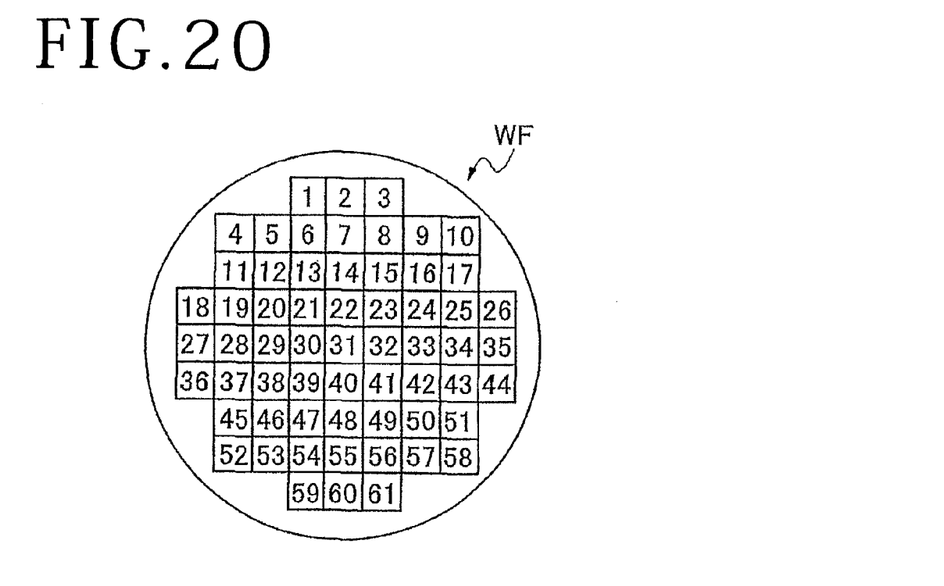
FIG. 20 is a plan view showing the configuration of a wafer to be tested for a die strength.

Wafer: silicon wafer
Diameter of the wafer: 8 inches
Thickness of the wafer (thickness of each device): 200 [μm] (after back polishing)
Device size: 10 [mm]×10 [mm]
Number of devices per wafer: 61 (see FIG. 20)

(1) Gettering Effect Test
(A) DLC Film Deposition Step

After performing the back grinding step and the back polishing step to three wafers, the DLC film deposition step was performed to these wafers to form three DLC films having different thicknesses of 100 [nm], 50 [nm], and 10 [nm] on the back sides of these wafers. Thereafter, the following steps (B) to (D) were performed to these wafers.

(B) Forced Contamination Step

A Cu standard solution (copper sulfate) was applied to the back side of each wafer on which the DLC film has been formed, in an amount of $1.0 \times 10^{13}$ [atoms/cm$^2$], which is the number of Cu atoms per unit area of the back side of each wafer having a diameter of 8 inches. In this manner, all the devices of each wafer were forcibly contaminated with copper.

(C) Heating Step

After drying the Cu standard solution applied to the back side of each wafer, each wafer was heated at 350[° C.] for three hours to make a condition that the copper atoms were easily diffused in each wafer.

(D) Measuring Step

All the wafers were cooled and the amount of copper atoms on the front side of each wafer opposite to the back side coated with the Cu standard solution was measured by using TXRF (total reflection X-ray fluorescence analyzer; manufactured by Technos Co., Ltd.) More specifically, the front side of each wafer was divided into rectangular regions each having a size of 15 [mm]×15 [mm]. In each rectangular region, the amount of copper atoms was measured at one position. Then, the average and the maximum value for the amount of copper atoms for all the rectangular regions were determined. Also before performing the forced contamination step, the amount of copper atoms was similarly measured on the front side of each wafer.

In the case that copper atoms were detected on the front side of each wafer, it can be determined that the copper atoms were diffused in each wafer and that the gettering effect was absent or insufficient. To the contrary, in the case that copper atoms were not detected on the front side of each wafer, it can be determined that the copper atoms were captured by the DLC film formed on the front side of each wafer and that the gettering effect was sufficient. The test result is shown in Table 1. In the above test, a threshold for the determination whether or not copper atoms were detected was set to $0.5 \times 10^{10}$ [atoms/cm$^2$].

TABLE 1

| Wafer No. | Film thickness [nm] | RF frequency [MHz] | Deposition time | Gettering effect |
|---|---|---|---|---|
| 1 | 100 | 13.56 | 2 minutes | obtained |
| 2 | 50 | 13.56 | 1 minute | obtained |
| 3 | 10 | 13.56 | 12 seconds | obtained |

As apparent from the test result shown in Table 1, the amount of copper atoms detected on the front side of each wafer after forced contamination becomes less than the threshold, and each wafer having the DLC film on the front side has a gettering effect.

(2) Die Strength Test

As shown in FIG. 20, the wafer WF can be divided into 61 chips (chip Nos. 1 to 61). After performing the DLC film deposition step to the wafer WF, the wafer WF was divided into the individual chips Nos. 1 to 61 and the die strength of each chip was measured. In the DLC film deposition step, three DLC films having different thicknesses of 100 [nm], 50 [nm], and 10 [nm] were formed on three wafers. Furthermore, a wafer subjected to only the back grinding step and a wafer subjected to both the back grinding step and the back polishing step were also prepared to measure the die strength of each wafer having no DLC film. A specific method for measuring the die strength will now be described.

(E) Die Strength Measuring Step

The die strength of each chip was measured by using a compression tester (AGI-1kN9) manufactured by Shimadzu Corporation. The measurement was made by the following method.

(E)-1

Figure 21:
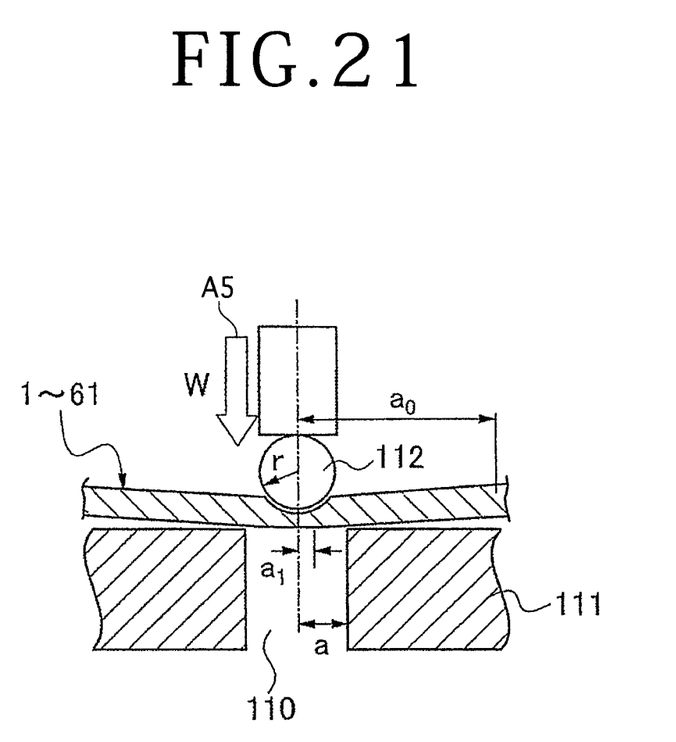
FIG. 21 is a sectional view showing a die strength test.

As shown in FIG. 21, each of the chips Nos. 1 to 61 is placed on a base 111 having a circular hole 110 at the center. At this time, the DLC film formed on the back side of each chip is oriented downward.

(E)-2

A spherical pressure element 112 having a spherical surface is set to press down each of the chips Nos. 1 to 61 in the direction shown by an arrow A5 in FIG. 21.

(E)-3

The die strength δ at the moment of breaking of each of the chips Nos. 1 to 61 is calculated by using Eq. (1).

$$\delta = \frac{3W9.8}{4\pi h^2}\left[(1+v)\left\{\frac{8}{3} + 2\mathrm{Ln}\frac{a}{a_1} - 2\mathrm{Ln}2\right\} + (1-v)\frac{a^2}{a_0^2}\left\{1 - \frac{2}{5}\frac{a_1^2}{a^2}\right\}\right] \quad \text{Eq. (1)}$$

In Eq. (1), the symbols for variables have the following meanings and values (see FIG. 21).
δ: die strength
W: breaking strength (value obtained in measurement) [kgf]
h: thickness of each device=200 [µm]
v: Poisson ratio (silicon)=0.28
a: radius of the hole=3.5 [mm]
$a_0$: radius of each device=5 [mm]

In Eq. (1), $a_1$ is the radius of a contact portion between the spherical pressure element 112 and each device, and a1 is calculated by using Eq. (2).

$$a_1 = \left\{\frac{3}{4}r\left(\frac{1-v^2}{\varepsilon_1} + \frac{1-v_2^2}{\varepsilon_2}\right)W\right\}^{\frac{1}{3}} \quad \text{Eq. (2)}$$

In Eq. (2), the symbols for variables have the following meanings and values.
$\varepsilon_1$: Young's modulus (silicon)=1.31×10³ [MPa]
$\varepsilon_2$: Young's modulus (spherical pressure element)=2.01×10⁴ [MPa]
r: radius of the spherical pressure element=3.0
$v_2$: Poisson ratio (spherical pressure element)=0.3

The die strengths of all the chips Nos. 1 to 61 of each wafer were calculated by using Eq. (1), and the average of the die strengths for each wafer was determined. The test result is shown in Table 2.

TABLE 2

| Wafer No. | Film thickness [nm] | Die strength [MPa] |
|---|---|---|
| 1 | 100 | 1195 |
| 2 | 50 | 1271 |
| 3 | 10 | 1177 |

TABLE 2-continued

| Wafer No. | Film thickness [nm] | Die strength [MPa] |
|---|---|---|
| 4 | 0 (grinding + polishing) | 1160 |
| 5 | 0 (grinding only) | 552 |

As apparent from Table 2, each wafer having the DLC film (wafer Nos. 1 to 3) has a die strength greater than 1000 [MPa], which is greater than or substantially equal to the die strength of the wafer No. 4 subjected to grinding+polishing (the back grinding step and the back polishing step) and having no DLC film.

(3) Optimum Film Thickness

As apparent from the result of the gettering effect test shown in Table 1, a sufficient gettering effect can be attained by setting the film thickness of the DLC film to 10 [nm] or more. Further, as apparent from the result of the die strength test shown in Table 2, a sufficient die strength can be attained by setting the film thickness of the DLC film to 10 to 100 [nm]. Accordingly, it is understood that a sufficient gettering effect and a sufficient die strength can both be obtained by setting the film thickness of the DLC film to 10 to 100 [nm].

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing the back side of a wafer having a plurality of spaced devices formed on the front side so as to be separated by a plurality of crossing division lines, said wafer processing method comprising:
    a back grinding step of grinding the back side of said wafer to thereby reduce the thickness of said wafer to a predetermined thickness;
    a back polishing step of polishing the back side of said wafer after performing said back grinding step, thereby removing grinding strain; and
    a diamond-like carbon film deposition step of forming a diamond-like carbon film on the back side of said wafer and side surfaces of the plurality of spaced devices after performing said back polishing step.

2. The wafer processing method according to claim 1, wherein said diamond-like carbon film has a thickness of 10 to 100 nm.

* * * * *